United States Patent [19]

Sachdev et al.

[11] Patent Number: 5,700,581
[45] Date of Patent: Dec. 23, 1997

[54] SOLVENT-FREE EPOXY BASED ADHESIVES FOR SEMICONDUCTOR CHIP ATTACHMENT AND PROCESS

[75] Inventors: Krishna G. Sachdev, Hopewell Junction; Michael Berger, Gardiner; Mark S. Chace, Poughkeepsie, all of N.Y.

[73] Assignee: International Business Machines Corporation, Armonk, N.Y.

[21] Appl. No.: 670,463

[22] Filed: Jun. 26, 1996

[51] Int. Cl.$^6$ ....................................... B32B 9/04
[52] U.S. Cl. ............................ 428/447; 528/27; 528/40; 528/26; 528/28; 528/12; 523/435; 524/708; 515/104; 515/100
[58] Field of Search .................. 528/27, 40, 26, 528/28, 12; 523/435; 524/708; 428/447; 525/104, 100

[56] References Cited

U.S. PATENT DOCUMENTS

| | | | |
|---|---|---|---|
| 4,480,009 | 10/1984 | Berger | 428/447 |
| 4,555,553 | 11/1985 | Hefner, Jr. | 525/523 |
| 4,557,860 | 12/1985 | DiSalvo et al. | 252/512 |
| 4,975,221 | 12/1990 | Chen et al. | 252/512 |
| 5,102,960 | 4/1992 | Imai et al. | 525/476 |
| 5,204,399 | 4/1993 | Edelman | 524/404 |
| 5,290,883 | 3/1994 | Hosokawa et al. | 525/423 |
| 5,350,811 | 9/1994 | Ichimura et al. | 525/476 |

OTHER PUBLICATIONS

Polymers From Siloxane–Containing Epoxides, *Journal of Polymer Science: Part A-1*, vol. 7, pp. 1089–1110 (1969).

Primary Examiner—Margaret W. Glass
Attorney, Agent, or Firm—DeLio & Peterson LLC; John J. Tomaszewski; Aziz M. Ahsan

[57] ABSTRACT

The present invention discloses chip (die) bond adhesive formulations preferably comprising a siloxane containing epoxide preferably a diglycidyl ether derivative, an anhydride curing additive which is soluble in the epoxide without the use of a solvent, and, optionally comprising, and oligomeric/polymeric co-additive of the type poly (alkylacrylate or -methacrylate), in conjunction with thermal and electrically conductive fillers and conventional co-catalysts used for curing epoxy systems to provide reworkable epoxy adhesives. Also disclosed are adhesive formulations comprising a siloxane containing epoxide and a hydroxybenzophenone curing additive which is soluble in the epoxide without the use of a solvent. The chips can be bonded to the substrate by conventional heating and curing techniques. With epoxy adhesive compositions comprising polyacrylate additives, the die bonded assembly can be reworked by heating the assembly to about 180° C. to 250° C. removing the chip, and rebonding a new chip on the same surface without any effect on the shear strength for die bonded on to gold, copper, silver or a ceramic die pad. Die shear strength using the adhesives remains unchanged when exposed to thermal shock involving −65° C. to +150° C. excursions, and HAST test at 130° C. /85 percent RH (Relative Humidity) or 85° C./85% RH. A method is also provided for using the adhesives to make electronic component assemblies.

22 Claims, No Drawings

SOLVENT-FREE EPOXY BASED ADHESIVES FOR SEMICONDUCTOR CHIP ATTACHMENT AND PROCESS

BACKGROUND OF THE INVENTION

1. Field of the Invention

The present invention is directed to solvent-free epoxy based chip (die) bond adhesive formulations for attaching the chip to a substrate and in particular, to both non-reworkable and reworkable epoxy based low stress adhesives which may optionally contain electrically and thermally conductive fillers. The die shear strength using these adhesives is maintained when the bonded chip assembly is exposed to thermal shock involving about −65° C. to about +150° C. excursions, temperature-humidity (85° C./85% RH) and/or the HAST test (Highly Accelerated Stress Test) at 130° C. /85% RH (Relative Humidity).

2. Description of Related Art

Die bond adhesives that are resistant to stress conditions used in product reliability testing, are free from the problem of resin bleed, and also are preferably reworkable without detriment to device or packaging materials, are required in the electronics industry. Die bond adhesives having these properties provide cost reduction in the fabrication of, e.g., single chip modules (SCM's) and multichip modules (MCM's), which are typically used in high end computers, automotive electronics, medical and telecommunication devices, cellular phones, and various other consumer products.

The commonly available glycidoxy ether of bisphenol A or bisphenol F based epoxy adhesives lack the flexibility required for stress absorption that is caused due to thermal mismatch between the bonded components during reliability exposure. These adhesives are also not generally reworkable.

Recently, several different types of paste and tape versions of thermoplastic polymer based film adhesives have become available in the commercial market which can be reworked by thermal flow. However, these thermoplastic adhesives are useful only for low temperature applications, such as, temporary attachment for burn-in and have been found to have the problem of voids in the bond layer and die adhesion variability. Also, the thermoplastic paste formulations which are available are solvent based, and have the problem of stringiness or tailing, phase separation of any filler such as silver from the polymer upon bake/cure, and, in general, have the problem of performance variability.

Yet another class of adhesives that may be reworked is based on silicone elastomer chemistry. These materials, however, also have the problem of paste stringiness, and more importantly have been found to suffer from adhesion degradation when a gold surface bonded die assembly is exposed to T/H (Temperature/Humidity) stress conditions. They also have the problem of outgassing of silicone-containing species when heated above 200° C. even with initially fully cured adhesive.

There are also available flexible epoxy based conductive adhesives in the commercial market which are claimed to be reworkable but these have the problems of unsatisfactory paste rheology, low thermal stability, variable performance in terms of reworkability, and in some cases have a pot life too short for any practical use in manufacturing environments.

The making of electronic components requires adhesives having improved properties and there is still a need for new die bond adhesives that meet at least some of the following properties. These properties include resistance to stress conditions used in product reliability testing, freedom from the problem of resin bleed, reworkability without detriment to device or packaging materials, high die shear strength, bond stability during reliability testing involving thermal cycling and T/H exposure and are thus useful in both non-hermetic and hermetic packages, void free die bond layer attachment, paste viscosity and rheology suitable for automated dispense tools and that these adhesives provide an overall cost reduction in the fabrication of electronic packages.

Bearing in mind the problems and deficiencies of the prior art, it is an object of the present invention to provide an adhesive which may be used in the manufacture of electronic components, and, in particular, to attach die or chips to substrate materials.

Another object of this invention is to provide die bond adhesives that are resistant to stress exposure conditions typically used in product reliability testing.

Yet another object of this invention is to provide die bond adhesives that are free from the problems of resin bleed.

Still another object of this invention is to provide die bond adhesives that are reworkable without detriment to device or packaging materials.

Yet another purpose of this invention is to provide a method for making electronic components by the use of adhesives to connect the components such as a chip to a substrate and to the electronic components made by the method.

Another purpose of the invention is to provide low stress epoxy adhesives particularly suitable for large die, e.g., 15 mm×15 mm or larger, bonding.

Other objects and advantages of the present invention will be apparent from the following description.

SUMMARY OF THE INVENTION

The above and other objects, which will be apparent to those skilled in the art, are achieved in the present invention which is directed in the first aspect to epoxy bond adhesive resins prepared from solvent-free curable compositions comprising a siloxane containing polyepoxide, a curing additive (e.g., hardening additive) for the epoxide which is soluble in the epoxide without the use of a solvent and a curing catalyst if needed. It is an important feature of the invention that the siloxane containing epoxide and curing additive be mutually soluble without the use of a solvent to achieve the superior adhesive performance properties of the compositions of the invention. The general term "polyepoxide", "epoxide" or "epoxy resin" is generally interchangeable and defined as any molecule containing more than one alpha-oxirane group capable of being polymerized by ring-opening reactions of the epoxy group. Exemplary widely used epoxy resins include the diglycidyl ethers of bisphenol A and bisphenol F which are made by reacting epichlorohydrin with bisphenol A or bisphenol F in the presence of a basic catalyst. In the preferred siloxane containing diglycidyl ether epoxides used in the invention, the bisphenol A or bisphenol F group is essentially replaced by the siloxane group. Typical siloxane epoxides useful for the purpose of this invention include commercially available bis(1,3-glycidoxy propyl)tetramethyl disiloxane; bis-(1,5 glycidoxy propyl)hexamethyl trisiloxane and related materials some of which are commercially available. These can be used as the pure epoxy component or in combination with non-siloxane epoxides, typically cycloaliphatic epoxides like ERL 4221 or the commonly used diglycidyl ethers of bisphenol A or bisphenol F. Other representative siloxane containing epoxy resins and their method of preparation are shown in U.S. Pat. No. 4,480,009 to Berger and in the article entitled "*Polymers From Siloxane-Containing Epoxies*" by William J. Patterson and Norman Bilow, Journal of Polymer Science: Part A-1, Vol. 7, Pages 1089-1110 (1969), both references being incorporated herein by reference.

In a second aspect of the invention epoxy based adhesives prepared from curable compositions that comprise a polyepoxide and a siloxane amine type curing additive for the polyepoxide such as a bis (amino) siloxane or a siloxane containing anhydride. A curing catalyst may also be used if needed. It is also important that these components be likewise mutually soluble without a solvent.

The curing additive for the epoxide moieties may be any of the known curing agents with the proviso that the curing agent be soluble in the epoxide. The curing agent will be typically selected from the group consisting of amines or anhydrides as conventionally used and hydroxy ketones such as the preferred hydroxy benzophenones that have been found to be soluble in siloxane-containing epoxides and excellent hardening agents for siloxane containing epoxides. Likewise, the curing catalyst may be any of the epoxide curing catalysts known in the art and will generally be a tertiary amine in conjunction with a proton source such as nonylphenol, ethylene glycol or propylene glycol for anhydride curing epoxy formulations. Alternate curing catalysts especially with hydroxy-benzopyhenone hardening additives may be metal salts of carboxylic acids as tin or zinc octoate, dibutyl tin dilaurate, copper naphthenates, aryl dicyanates, etc.

In another aspect of the present invention, there is provided adhesive compositions which are reworkable by heating the epoxy adhesive bonded components to cause softening of the adhesive such that the chip can be selectively pulled. Any residue remaining after chip removal may be removed by polishing or grinding the substrate to generate a fresh surface for bonding of a new die over the clean region without effecting the shear strength. The reworkable adhesive compositions are compositions as defined above and comprise a siloxane containing epoxide or a commonly used epoxide such as the glycidoxy ethers of polyhydric phenols, a hardener for the epoxide (with or without siloxane containing structural feature ) which is soluble in the epoxide without the use of a solvent, preferably an anhydride, a curing catalyst, if needed, and in addition, an oligomeric or polymeric additive selected from the group consisting of polyacrylate, polymethacrylate and/or a poly-fluoralkyl acrylate or methacrylate component which has been found to impart reworkable properties to the siloxane epoxide based adhesive composition. The polyacrylate based additives that have been found to impart reworkability to the adhesives are preferably soluble in the adhesive composition.

In another aspect of the invention, there are provided adhesive compositions which are both non-reworkable and reworkable as defined above and which further contain metallic or other fillers to provide thermal and conductive and other properties to the adhesive.

Yet in another aspect of the invention adhesive compositions are provided for low stress adhesive bonding of large chips to a substrate.

In a further aspect of the invention, there is provided a method for making electronic components by the use of the above adhesives to connect components such as a chip to a ceramic or metal surface, typically Au, Cu and Ag which comprises applying a coating of the adhesive onto the substrate and/or the chip, chip placement on the coated substrate, and heating at 90°-110° C. for 30-45 minutes followed by curing at 150°-170° C. for 30-60 minutes. For an electronic component assembly made using a reworkable adhesive, the attached die or other component can be pulled or removed (reworked) by heating the assembly at an elevated temperature to soften the adhesive to facilitate selective removal of a defective chip.

The adhesive compositions of the invention and the electronic components made using the method of the invention provide electronic components which are effectively bonded and have an adhesive bond that is hydrophobic and resistant to T/H effects, show high shear strength due to improved substrate/die interface adhesion both with Au and silicon back die on Au or ceramic pad, provide a void-free bond layer and are optionally reworkable, among other superior properties.

3. Detailed Description of the Invention

According to this invention, solvent-free improved epoxy based die attach adhesives, with and without reworkability properties, comprise siloxane containing epoxides, or siloxane epoxides in combination with non-siloxane epoxides, preferably diglycidyl ether derivatives for siloxane epoxides, with or without cycloaliphatic epoxides, cured with hardening additives which are soluble in the epoxide without the use of a solvent and which are preferably anhydrides that are commonly known for epoxide curing or hydroxybenzophenones as alternate epoxide curing additives which according to this invention have been found to be effective hardeners. It is important that the epoxide and curing agent be mutually soluble without the use of a solvent and highly preferred that the mutual solubility be at the temperature of use and more highly preferred over a wide range of temperatures from storage temperatures of below −20° C. to room temperature to the temperature of use.

An epoxide may also be cured with amines preferably a siloxane containing aromatic amine such as siloxane containing aromatic diamines or a siloxane containing dianhydride. The curing additives and epoxide are mutually soluble without a solvent. For reworkable epoxy adhesives according to this invention, poly(n-alkylacrylate) and poly(n-alkylmethacrylate) and related polymers are co-additives and are preferably miscible in the epoxide/curing additive blends. Both compositions contain conventional epoxy curing catalysts such as a tertiary amine and a proton source typically ethylene glycol or nonylphenol, or metal carboxylates as tin-octoate, dibutyl(tin-dilaurate) and liquid aryl dicyanates, specifically AroC-L10 which is a liquid dicyanate ester monomer ethylidene bis 4,1 phenylene dicyanate commercially available form Rhone-Poulenc Inc., Louisville, Ky. U.S.A. Electrically conductive fillers such as silver flakes and/or ceramic fillers are used to provide conductive (electrical and thermal) formulations.

The siloxane containing epoxide based adhesives of this invention do not require a solvent and are free of the problem of resin bleed, maintain interface integrity during product reliability testing including thermal shock and temperature-humidity excursions, have excellent rheology that is compatible with autodispense tools, and, for the reworkable formulation, are reworkable without the use of a solvent. For rework, the bonded assembly is heated typically at about 200° C. to about 250° C. to soften the adhesive to allow the chip to be pulled off (removed) selectively. Any residue may be removed by polishing or grinding the substrate, and a new die can be bonded on the same surface without any change in the shear strength.

According to this invention, curable adhesive compositions with improved performance in semiconductor chip attachment are obtained with miscible blends of siloxane containing epoxides, preferably anhydrides or hydroxybenzophenones as curing additives, and conventional epoxy curing catalysts. Conductive fillers to form thermally and electrically conductive adhesive pastes may be incorporated into the formulation in amounts up to about 50% and above, typically 70-to 85% by weight of the total formulation.

The siloxane containing epoxy based adhesive formulations can be further modified to provide a reworkable adhesive composition by incorporating low molecular weight acrylate polymers that are found to be miscible in the adhesive formulation without requiring a solvent. In general, molecular weights up to 40,000 have been found suitable.

Representative siloxane containing polyepoxides useful for the purpose of this invention are represented by the general formula;

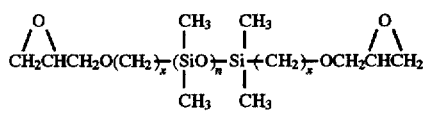

wherein X is 2 to 8 carbon atoms and n is 1 to 10, preferably 1 to 6.

Preferred siloxane containing epoxides include: bis-(1,3-glycidoxypropyl) tetramethyl disiloxane, bis-(1,3-glycidoxybutyl) tetramethyl disiloxane, and bis-(glycidoxypropyl or -butyl) hexamethyl trisiloxane. Other siloxane containing epoxides include: 1,5-bis[p-(2,3-epoxypropyl) phenyl] hexamethyl trisiloxane and 1,7-bis[p-(2,3-epoxypropyl)phenyl] octamethyltetrasiloxane, which are represented by the general formula:

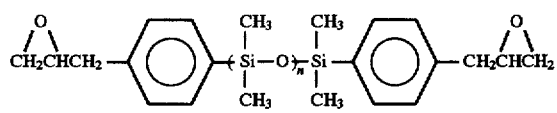

wherein n is 1 to 4.

Representative anhydrides as curing additives according to this invention include hexahydrophthalic anhydride (or bis-1,2-cyclohexane dicarboxylic anhydride), methylhexahydro phthalic anhydride, maleic anhydride, succinic anhydride, (2, dioxytetrahydrol)-3-methyl-3-cyclohexene-1, 2-dicarboxylic anhydride, alicyclic anhydrides and dianhydrides and the like.

Representative compounds among the poly hydroxybenzophenones as epoxy hardeners according to this invention include 2,2',4,4'-tetrahydroxybenzophenone, 2,3,4-trihydroxybenzophenone and 2,4'-dihydroxybenzophenone. The benzophenones additives are preferably used in conjunction with dibutyl-tin-dilaurate and/or AroC-L10 liquid aryl dicyanate as a curing catalyst. The curing additives may also be siloxane containing, e.g., siloxane containing anhydride, for reactions with an epoxide.

In general, the amount of epoxide and curing additives are present in substantially equimolar amounts, but the epoxide: curing additive molar ratio may vary from about 3:1 to 1:3, e.g., about 2:1 to 1:1.8 although lower or higher ratios may be employed depending on the reactants and properties desired.

The acrylate polymer optional co-additives to provide reworkable adhesive formulations include polyacrylates and polymethacrylates and polyalkyl acrylates and polyalkyl methacrylates such as poly(n-butylacrylate and/or n-butylmethacrylate), poly(n-fluorobutyl methacrylate), and polymethyl methacrylate. In general, the alkyl group may be about C1–C8, preferably C2–C4. The acrylate polymer is preferably miscible in the adhesive formulation.

Preferred catalyst systems according to this invention comprise 2,4,6-tris-(dimethylaminomethyl phenol) and nonylphenol although the standard epoxy catalysts can also be employed in the adhesive formulations of these formulations. Exemplary epoxy catalysts include benzyl dimethyl amine-ethylene glycol; tris-dimethylamino methyl phenol-ethylene glycol; N,N-dimethyl ethanol amine; N,N,N$^1$,N$^1$-tetrakis(2-hydroxypropyl) ethylene diamine and the like.

A preferred electrically conductive filler is Ag flakes having less than about 10 micron average size, although up to about 30 microns may be used or higher. Other fillers that can also be used are Ag powder, Au, Ni, Cu, silica, alumina, aluminum nitride, or a ceramic filler. Amounts up to about 80% or higher by weight of the total formulation may be employed with preferred amounts of 60% to 80% being typically employed. The fillers may be blended into the formulation using conventional techniques known for obtaining polymer/filler dispersions such as high shear mixers or rotary mixers.

The adhesive formulations of this invention are solvent-free, have paste rheology and viscosity suitable for autodispense tools, have long storage stability, require no prior surface treatment of the substrate for durable bonding and provide void-free attachment of components to gold and ceramic surfaces with no resin bleed problem. When the adhesives of this invention that are reworkable are used to attach semiconductor chips, the chip can be reworked by heating the assembly at about 200° C. to about 250° C. for about 1 to about 2 minutes and pulling it. Any residue can be cleaned by polishing or grinding the substrate surface, and a new die can be bonded on the same surface with no significant change in shear strength. The cured adhesives of this invention for both the reworkable and nonreworkable formulations are highly hydrophobic, show low moisture uptake as compared to the standard epoxy adhesives, and maintain adhesion during reliability exposure involving thermal excursions and temperature-humidity cycling.

In a preferred embodiment because of its demonstrated effectiveness, bis-(1,3-glycidoxypropyl)-tetramethyldisiloxane and cis-1,2-cyclohexane dicarboxylic anhydride in essentially equimolar amounts form a miscible blend when heated to about 60° C. to 65° C. and the mixture remains miscible when cooled to room temperature or below. It is further preferred for a reworkable formulation that about 5 to about 15 percent by weight (of the epoxide curing additive mixture) of poly(n-butylmethacrylate) or related materials be added to these siloxane containing epoxide/anhydride blends with compatible/clear solutions being formed. These blends can then be used to formulate reworkable conductive adhesives by dispersing therein, a filler, preferably silver flakes, and a standard anhydride curing epoxy catalyst comprising a tertiary amine and a proton source, preferably tris-dimethylaminomethyl phenol and nonylphenol. It is also preferred that the same siloxane-containing diepoxide and 2,2',4,4'-tetrahydrxybenzophenone be blended in a molar ratio of about 2:1, respectively to form a compatible/clear solution which can be used to disperse up to about 70 to about 85 percent (by weight) of Ag flakes or other filler material. The dispersion is catalyzed using metal carboxylate, typically tin or zinc octoate, dibutyl(tin-dilaurate) and liquid aryl dicyanates such as AroC-L10 to form an excellent non-reworkable conductive adhesive for component attachment to gold and ceramic surfaces.

A typical bonding process using the adhesives of the invention are exemplified by a blend containing bis-(1,3-glycidoxypropyl)-1,1,3,3-tetramethyldisiloxane/ hexahydrophthalic anhydride or 2,2',4,4'-tetrahydroxybenzophenone in conjunction with fillers, e.g., Ag, and curing catalysts described above and comprises dispensing the blend on the substrate, placing the die on the adhesive on the substrate heating at about 100° C. to about 110° C. for about 30 minutes followed by curing at about 150° C. to about 165° C. for about 30 to about 60 minutes and preferably 160°–165° C. for about 30–45 minutes. Times and temperatures may vary widely depending on the properties desired.

With reworkable adhesives of the invention, the die can be pulled off by a shearing action (removed) by heating at about 180° C. to about 200° C. or higher, e.g., 250° C. for about 1 to about 2 minutes. The residue on the substrate surface may be easily cleaned by polishing or grinding to generate a fresh surface for bonding of a new die.

Conductive adhesive compositions based on siloxane containing epoxides and/or epoxides cured with siloxane containing curing agents according to this invention can also be obtained with amine curing additives which are miscible with the epoxide. It has been found that unlike the commonly used aromatic amines in epoxide curing, bis (aminophenoxy benzene) (APB) and 2,2-bis[4-(4-aminophenoxy)phenyl hexafluoropropane] (BDAF) dissolve in the above siloxane containing diepoxide (bis-(1,3 glycidoxy propyl)-1,1,3,3- tetramethyl disitoxane) without the use of a solvent and are preferred. Conductive fillers, typically silver flakes, may also be added if desired. As noted above, bis(amino) siloxanes may be used to cure epoxides and provide suitable adhesives.

It has been found that curing of the siloxane containing epoxide blend is much slower with aromatic amine curing additives relative to the anhydride hardeners and thus the anhydride curing additive is preferred according to this invention. Alternate epoxide compositions having siloxane amines as curing additives that are useful for the purpose of this invention are those described by W. J. Patterson and N. Bilow) supra which article is concerned with dielectric properties of siloxane epoxide based compositions for the purpose of encapsulation of electronic circuitry. Exemplary epoxides include 1,5-bis[p-(2,3-epoxy-propyl)phenyl] hexamethyltrisiloxane and 1,9-bis[p-(2,3- epoxy-propyl) phenyl] decamethylpentasiloxane.

The amines as a curing additive described by Patterson and Bilow are siloxane-modified aromatic amines which are compatible with siloxane-containing epoxides and include 1,3-bis-(p-aminophenoxy) tetramethyl disiloxane and 1,5-bis-(p-aminophenoxy) hexamethyl trisiloxane. Bis(amino) siloxanes shown in Berger are also useful.

Conductive adhesive formulations can be obtained by forming a soluble mixture with a siloxane epoxide and siloxane amine, siloxane epoxide and amine or epoxide and siloxane amine or mixture of siloxane epoxide and cycloaliphatic epoxide and siloxane amine or standard aromatic or aliphatic amine and mixing a conductive filler, typically silver flakes by conventional methods of forming polymer/filler dispersions. This paste can be used for die bonding and has been found to form a low stress flexible matrix when thermally cured. Similar compositions can be formed using a siloxane containing anhydride or standard anhydrides in conjunction with siloxane epoxide, mixture of siloxane epoxide and non-siloxane epoxide or conventional epoxides.

EXAMPLES

The following examples are intended to further illustrate the invention and are not intended to limit the scope of the invention in any manner.

Example 1

A mixture of 3.2g (8.7 mmole) 1,3-bis-(glycidoxypropyl) tetramethyldisiloxane, 0.8 g of poly(n-butylmethacrylate) and 1.54 g (10 mmole) of 1,2-cis-hexahydrophthalic anhydride was heated at about 50° C. to about 60° C. with stirring to form a clear solution. Alternately, the anhydride curing additive was first dissolved in the epoxy monomer by heating at 50 to 60 C. and the polyacrylate additive was dissolved in this solution. The mixture was cooled to room temperature after which 0.1 g nonylphenol and 0.1 g tris-(2,4,6- dimethylaminomethyl)-phenol were blended in, followed by the addition of 19.6 g of silver flakes (average particle size less than 10 micron). The blend was mixed to form a conductive adhesive resin-filler dispersion. The formulation was stored below −20° C. until used in Example 2.

Example 2

A semiconductor chip was attached to the substrate using the adhesive of Example 1. Before use, the adhesive was thawed to bring it to room temperature, dispensed on plated gold or bare ceramic die pad or ceramic substrate followed by chip placement with light pressure. The assembly was heated at about 100° C. to about 110° C. for about 30 minutes and cured at about 160° C. to about 165° C. for 45 minutes in a $N_2$ purged oven and cooled to about 80° C. before removing the assembly. Die shear test using a standard shear tester showed greater than 10 kg shear strength for a 12.7 mm by 8 mm chip. The shear strength remained unchanged upon exposure of this assembly to stress conditions involving 150 hours HAST test (130° C. / 85 percent humidity) and −65° C. to +150° C. thermal shock test involving 1000 cycles. The die could be easily pulled and removed when heated at about 180° C. to about 200° C.–250° C. for about 1 to about 2 minutes. Any residue on the substrate side was easily removed by polishing the surface of the substrate. A new chip bonded to the surface as above using the same adhesive resulted in a shear strength equivalent to the original shear strength.

Example 3

An adhesive mixture was formed with the same components as in Example 1, except that 3.2 g (8.7 mmole) of the epoxide and about 2.1 g (13.6 mmole) of the hexahydro phthalic anhydride curing additive were used keeping all other ingredients the same. Die bonding tests with the conductive adhesive paste obtained therefrom showed that the performance of this paste was equivalent to the results of Example 2.

Example 4

A mixture of 3.66 g (10 mmole) of 1,3-bis (glycidoxypropyl) tetramethyldisiloxane and 1.2 g (5 mmole) of 2,2',4,4'-tetrahydroxybenzophenone was heated with stirring at 50° C. to about 60° C. to form a clear solution. This solution was then cooled to room temperature and 0.1 g dibutyl-tin-dilaurate and 0.2 g liquid aryl dicyanate AroC-L10 were mixed in followed by 14.5 g silver flakes and the mixture blended to obtain a uniform dispersion. This conductive adhesive formulation was stored below −20° C. until use in Example 5.

Example 5

A semiconductor chip was attached to a substrate using the adhesive of Example 4. The adhesive at room temperature was dispensed on the substrate having a plated gold or bare ceramic bonding surface followed by chip placement with light pressure. The assembly was heated at 100° C.–110° C. for 30 min and cured at 160° C.–165° C. for 45 min. in a N₂ purged oven and allowed to cool to about 80° C. before removing from the oven. Die shear test showed greater than 10 kg shear strength for a 12.7×7.5 mm chip. The shear strength remained substantially unchanged (>10 Kg) after reliability stress exposures involving 168 hours temperature-humidity ( 85C./85% humidity ) excursions and 200 cycles at −65° C. to +150° C. for thermal shock.

Example 6

The conductive adhesive formulation of Example 1 was prepared with the exception that the catalyst system was substituted with benzyldimethyl amine and ethylene glycol. No change in the adhesive performance was observed.

Example 7

A mixture of 5.2 g (14.2 mmole) 1,3-(glycidoxypropyl) tetramethyldisiloxane and 4.1 g (26.6 mmole ) of hexahydrophthalic anhydride was stirred in with heating at 50 to 60 C. till a clear solution was formed. This was followed by the addition of 0.5 g of narrow molecular weight poly (methylmethacrylate) and the mixture heated again with stirring till the additive dissolved. The solution was cooled to room temperature and a catalyst system comprising (0.2 g) nonylphenol and (0.1 g) tris-2,4,6-dimethylaminomethyl phenol was added followed by blending 34.5 g silver flakes having an average particle size less than 10 micron till a homogeneous dispersion was formed. This formulation was stored below −20° C. until used. Use of the formulation as an adhesive showed for chip attachment to substrate showed similar adhesive properties as were obtained using the adhesive of Example 1.

Example 8

A semiconductor chip was attached using the conductive adhesive of Example 7 using the bonding procedure described in Example 2. The die shear strength with a 12.7×8 mm die on a plated gold or ceramic surface was greater than 10 kg. This value was unaffected by stress exposures involving HAST temperature-humidity and thermal cycling at −65° C. to +150° C. The chip could be pulled by shearing when heated at 180° C.–200° C. to 250° C. for 1–2 min. Any residue remaining on the substrate was polished off, and a new chip was attached on the same surface with no change in the shear strength in comparison to the fresh surface.

Example 9

A mixture of 1,3-bis(glycidoxypropyl) tetramethyldisiloxane( 0.6 g ), cycloaliphatic epoxide ERL 4221( 1.9 g ) and maleic anhydride ( 0.6 g ) was stirred at 50C. till a homogeneous solution was formed. This was cooled to room temperature and 50 mg of nonylphenol and 30 mg trisdimethylamino methyl phenol were mixed and then 8.2 g of silver flakes were blended in till a homogeneous dispersion was obtained. Chip attachment using the procedure of Example 2 showed >10 Kg shear strength for a 12×7 mm chip on Au die pad or ceramic substrate. Unlike the adhesive of Example 1, in this case the chip could not be removed by heating at an elevated temperature.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A solvent-free curable epoxy base adhesive resin composition which is made without solvents and which when applied as an adhesive and cured to bond electronic components maintains adhesion during product stress testing, the composition comprising a solution of:
   a siloxane containing polyepoxide;
   a curing additive for the polyepoxide; and
   a curing catalyst for the polyepoxide;
   the siloxane containing polyepoxide, the curing additive and curing catalyst being mutually soluble without a solvent at the temperature of application.

2. The composition of claim 1 wherein the polyepoxide is represented by the formula:

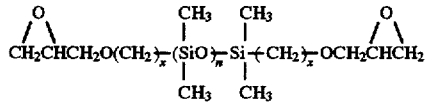

wherein x is 2 to 8 and n is 1 to 10.

3. The composition of claim 2 wherein the curing additive is selected from the group consisting of anhydrides, amines and hydroxybenzophenones.

4. The composition of claim 1 further comprising a conductive filler.

5. The composition of claim 1 further comprising an additive to the composition wherein the additive enables the bonded components to be reworked without the need for solvents which additive is selected from the group consisting of polyacrylate, poly(meth)acrylate, polyalkylacrylate and polyalkylmethacrylate, polyfluoro alkyl acrylate and polyfluoroalkyl methacrylate wherein the alkyl group is C1–C8.

6. The composition of claim 5 further comprising a conductive filler.

7. The composition of claim 6 wherein the polyepoxide is a siloxane containing diglycidyl ether epoxide and the curing additive is an anhydride.

8. The composition of claim 3 wherein the polyepoxide is selected from the group consisting of bis(1,3-glycidoxy propyl) tetramethyl disiloxane, bis(1,5-glycidoxy propyl) hexamethyl trisiloxane and mixtures thereof.

9. The composition of claim 8 wherein the curing additive is selected from the group consisting of hexahydrophthalic anhydride, methyl-hexa hydrophthal anhydride, maleic anhydride, succinic anhydride, alicyclic anhydrides, alicyclic dianhydrides and mixtures thereof.

10. The composition of claim 9 further comprising an additive to the composition wherein the additive enables the bonded components to be reworked without the need for solvents which additive is selected from the group consisting of polyacrylate, poly(meth)acrylate, polyalkylacrylate, and polyalkymethacrylate, polyfluoroalkyl acrylate and polyfluoroalkyl methacrylate wherein the alkyl group is C1–C8.

11. The composition of claim 2 wherein the epoxide is selected from the group consisting of bis(1,3-glycidoxy propyl)tetramethyl disiloxane, bis(1,5-glycidoxy propyl) hexamethyl trisiloxane and mixtures thereof.

12. The composition of claim 11 wherein the curing additive is a hydroxybenzophenone selected from the group consisting of 2,2',4,4'-tetrahydroxybenzophenone; 2,3,4 trihydroxy benzophenone; 2,4'dihydroxybenzophenone and mixtures thereof.

13. An article of manufacture comprising a substrate having disposed thereon a polymeric composition comprising the reaction product of the solvent-free curable epoxy based adhesive resin composition of claim 1.

14. The article of claim 13 which is an electronic component.

15. The article of claim 13 wherein the electronic component comprises a chip attached to a substrate by the adhesive composition.

16. An article of manufacture comprising an electronic component having a chip bonded to a substrate by the adhesive composition of claim 5.

17. An article of manufacture comprising an electronic component having a chip bonded to a substrate by the adhesive composition of claim 6.

18. An article of manufacture comprising an electronic component having a chip bonded to a substrate by the adhesive composition of claim 7.

19. A method for making an electronic component assembly which requires attachment of separate components comprises:

applying the adhesive of claim 1 onto one of the components to be bonded;

placing the other component to be bonded on the adhesive of the adhesive coated component;

heating the assembly to cure the adhesive to attach the components.

20. The method of claim 19 wherein the adhesive further comprises a conductive filler.

21. The method of claim 19 wherein the adhesive further comprises an additive to the composition wherein the additive enables the bonded components to be reworked without the need for solvents which additive is selected from the group consisting of polyacrylate, poly(meth)acrylate, polyalkylacrylate and polyalkylmethacrylate, polyfluoro alkyl acrylate and polyfluoroalkyl methacrylate wherein the alkyl group is C1–C8.

22. The method of claim 19 wherein the adhesive further comprises a conductive filler and an additive to the composition wherein the additive enables the bonded components to be reworked without the need for solvents which additive is selected from the group consisting of polyacrylate, poly(meth)acrylate, polyalkylacrylate and polyalkylmethacrylate, polyfluoro alkyl acrylate and polyfluoroalkyl methacrylate wherein the alkyl group is C1–C8.

* * * * *